United States Patent [19]

Ernst

[11] Patent Number: 4,712,088

[45] Date of Patent: Dec. 8, 1987

[54] MULTISTAGE ANGLE ENCODER WITH AN IMPROVED ALLOCATION OF COARSE CODE INFORMATION TO FINE CODE INFORMATION

[75] Inventor: Alfons Ernst, Traunreut, Fed. Rep. of Germany

[73] Assignee: Dr. Johannes Heidenhain GmbH, Traunreut, Fed. Rep. of Germany

[21] Appl. No.: 674,229

[22] Filed: Nov. 21, 1984

[30] Foreign Application Priority Data

Nov. 26, 1983 [DE] Fed. Rep. of Germany ....... 3342940

[51] Int. Cl.$^4$ ............................................ H03M 1/26
[52] U.S. Cl. .......................... 340/347 P; 250/231 SE; 340/347 M
[58] Field of Search ...................... 340/347 P, 347 M; 250/231 SE

[56] References Cited

U.S. PATENT DOCUMENTS

| | | | |
|---|---|---|---|
| 3,531,798 | 9/1970 | Dureau | 340/347 P |
| 3,738,504 | 6/1973 | Vail et al. | 414/19 |
| 3,824,587 | 7/1974 | Fowler | 340/347 P |
| 3,898,649 | 8/1975 | Beck | 340/347 P |
| 4,422,065 | 12/1983 | Radomirov et al. | 340/347 P |

FOREIGN PATENT DOCUMENTS 2126510 6/1973 Fed. Rep. of Germany .
2746854 4/1982 Fed. Rep. of Germany .

Primary Examiner—T. J. Sloyan
Attorney, Agent, or Firm—Willian Brinks Olds Hofer Gilson & Lione Ltd.

[57] ABSTRACT

A multistage angle encoder includes a fine code disc which is connected via a reducing gear with at least one coarse code disc. In order unambiguously to allocate the coarse code information on the coarse code disc to the fine code information on the fine code disc, control information data is applied to the fine code disc to directly superimpose on the coarse code information of the coarse code disc. The control code information is provided in each case on two concentric control half-tracks of the fine code disc, and the coarse code information is provided in each case on two concentric coarse code half-tracks of the coarse code disc. The superposed coarse code half-tracks and control half-tracks are scanned in common by means of a single scanning field of the scanning plate.

10 Claims, 6 Drawing Figures

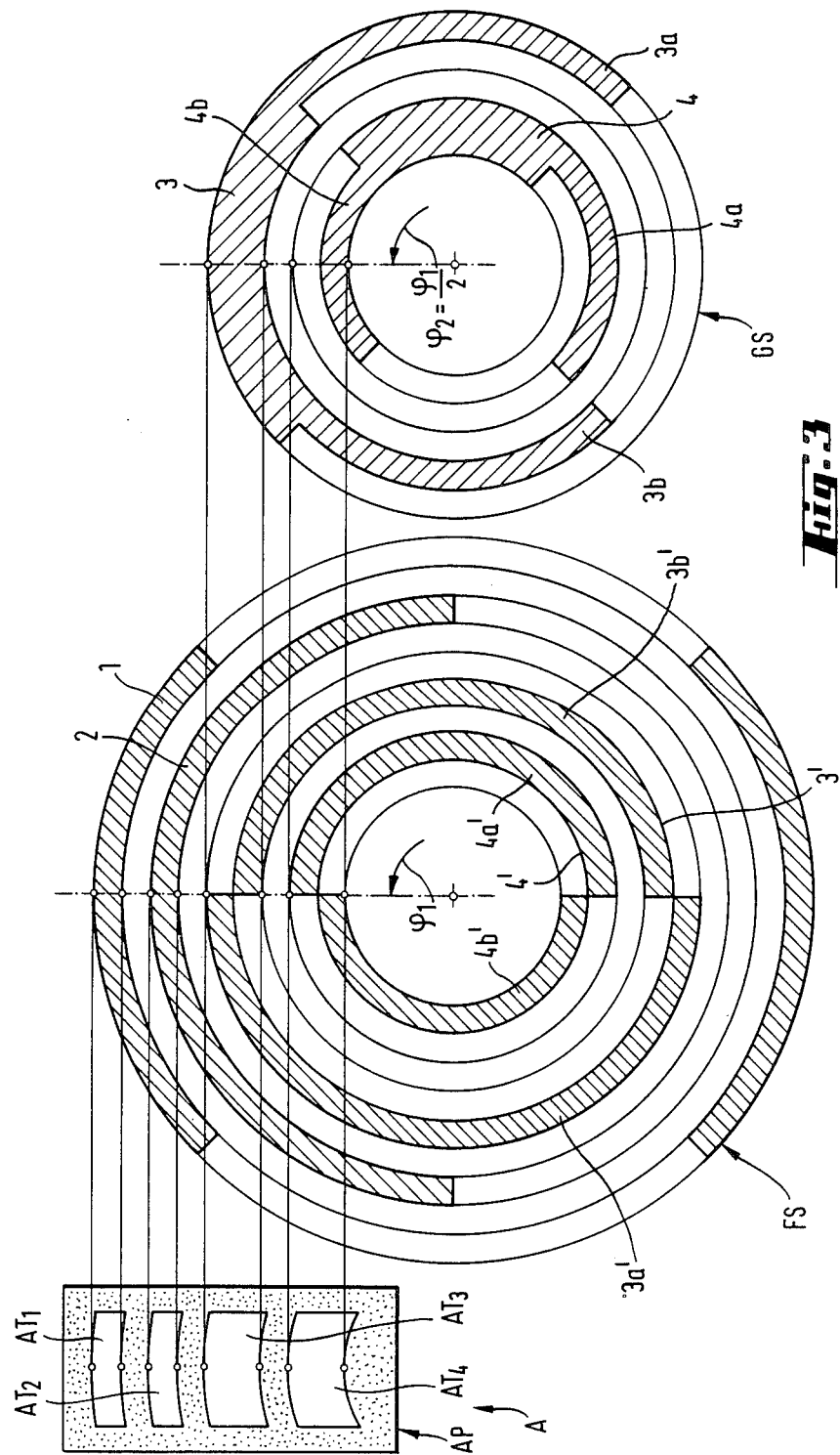

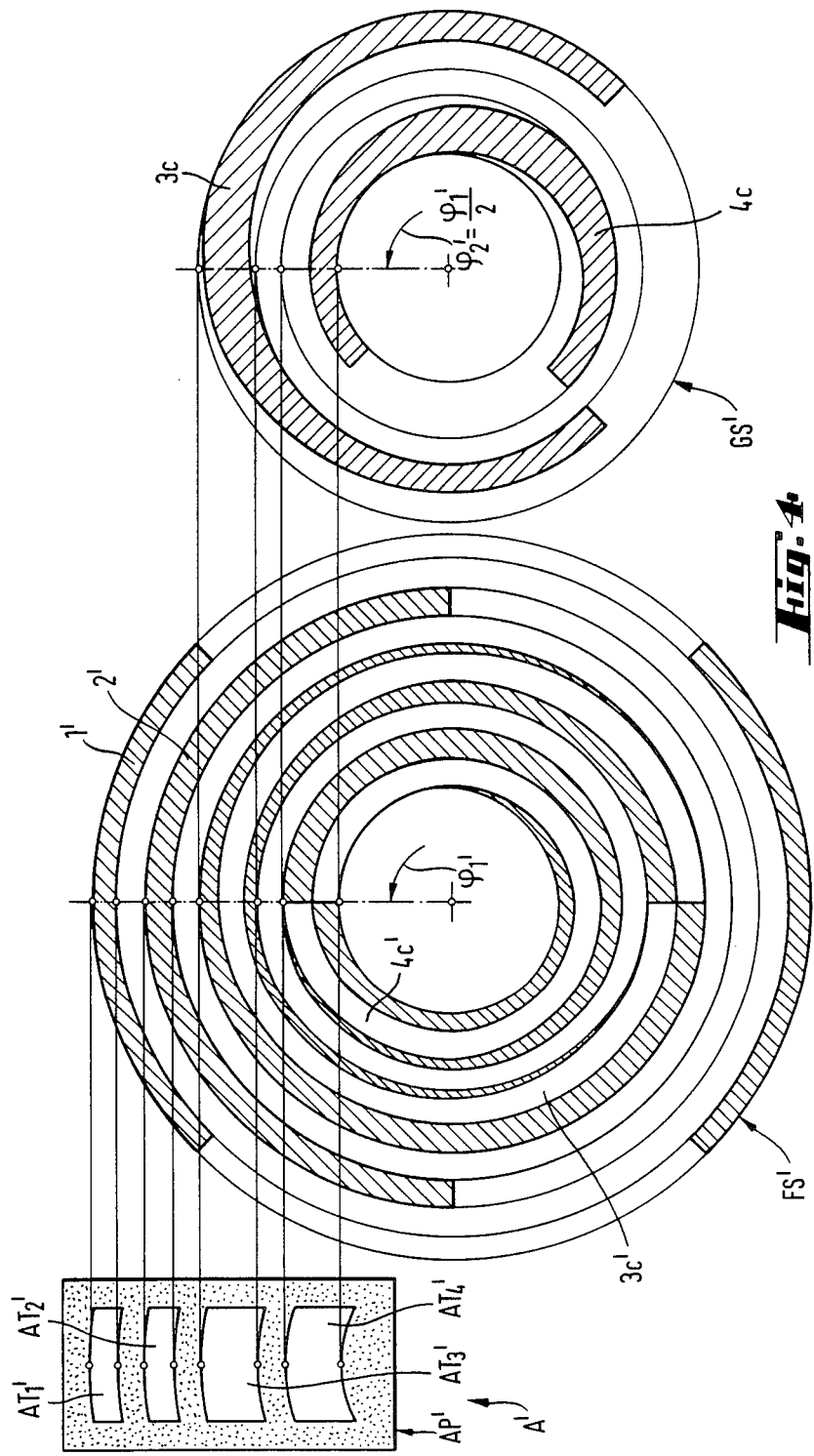

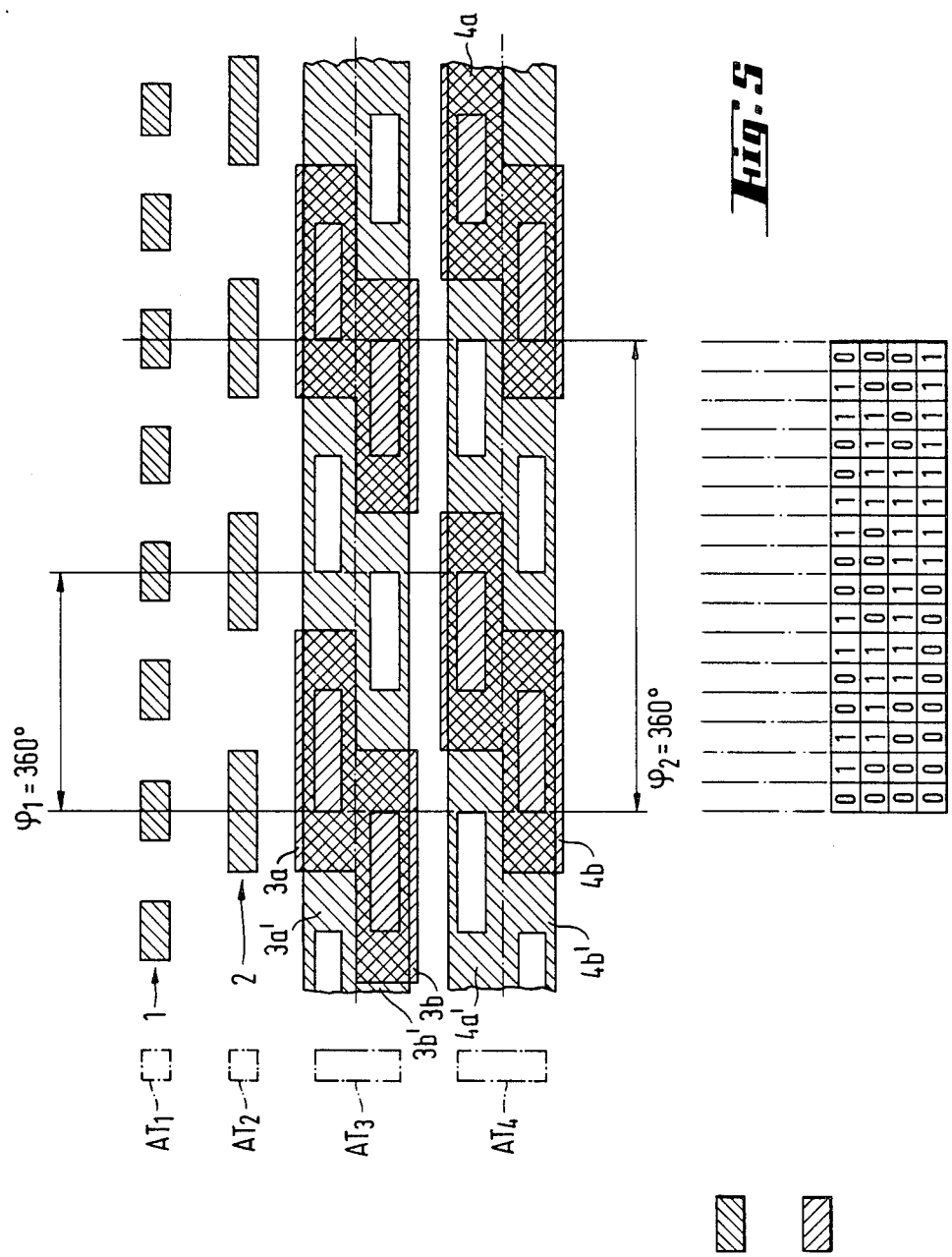

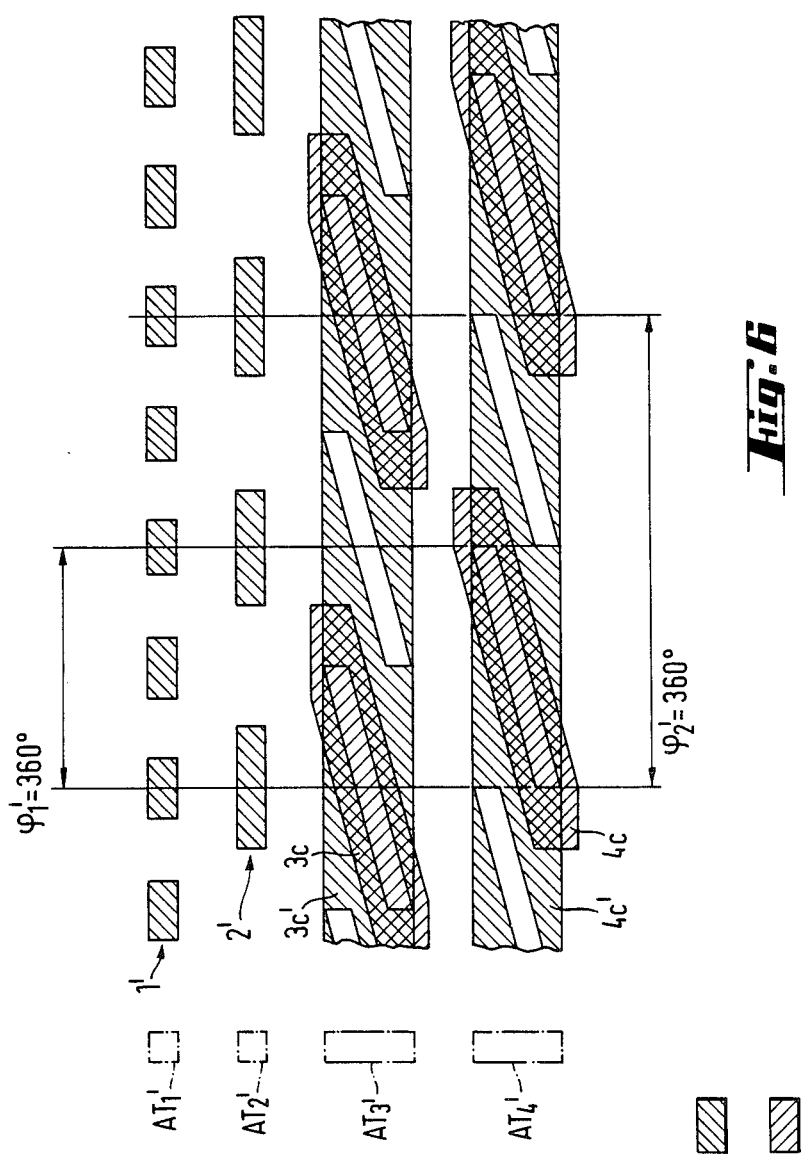

MULTISTAGE ANGLE ENCODER WITH AN IMPROVED ALLOCATION OF COARSE CODE INFORMATION TO FINE CODE INFORMATION

BACKGROUND OF THE INVENTION

The present invention relates to an improved multistage angle encoder of the type which includes a drive shaft, a fine code disc coupled to the drive shaft, a gear drive coupled to the drive shaft, a coarse code disc coupled to the gear drive, and a scanning unit positioned to scan the fine and coarse code discs.

Such multistage angle encoders serve for the measurement of the angular position of a shaft over several revolutions. Such encoders can be used, for example, in order to determine the absolute position of a slide piece of a machine tool based on the measured angular position of the drive spindle. Two examples of such angle encoders are disclosed in German DE-AS No. 21 26 510, and German patent No. DE-PS 27 46 854.

Such angle encoders, which are designed to measure an angle n·360°, include a first code disc connected with the shaft of the angle encoder, and this first fine code disc clearly defines the absolute fine position of the shaft in z steps within the angle of 360°. In addition, at least one coarse code disc is provided which is connected with the shaft of the angle encoder by means of a reducing gear with a reduction factor n. This coarse code disc is used to characterize the absolute coarse position of the shaft within the angle n·360° in a clear, unambiguous code. In this way, the absolute position of the shaft is represented in coded form as one of a number of n·z angular steps.

Preferably, angle encoders utilize one-step codes, in which adjacent binary combinations are distinguished from one another by a change in only a single binary place, in order to define the coded angle in such a way as to reduce undefined intermediate stages during the transition from one angular position to the next angular position. Such one-step codes in general tend to reduce the electronic complexity and cost of the system. In such one-step codes, however, the measuring accuracy is determined by the code information data on all of the code tracks on both code discs. The reducing gears of a multistage angle encoder are, however, in general insufficiently accurate to allocate the code information of the coarse code disc exactly to the code information of the fine code disc. That is, the two code discs can be positioned out of synchronization with respect to one another. For this reason, the code information of each code track of the coarse code disc is typically double-scanned (once with a phase lead and once again with a phase lag). A signal derived from the fine code disc is used in conjunction with a switching logic circuit to determine which coarse code information (the one with phase lead or the one with phase lag) is to be used (principle of U-scanning). This double scanning, however, is relatively expensive to implement, especially in the case of large measuring lengths which result in the use of many code tracks.

SUMMARY OF THE INVENTION

The present invention is directed to a multistage angle encoder of the general type described above in which the code information on multiple code discs can be scanned with high measuring accuracy in a remarkably simple and efficient manner.

According to this invention, a multistage angle encoder of the type described initially above is provided with means for defining control information on the fine code disc, positioned to be superposed over the coarse position information of the coarse code disc. This control information is adapted to allocate the coarse position information of the coarse code disc to the fine position information of the fine code disc clearly and unambiguously.

The present invention provides important advantages in terms of its extreme simplicity. In a remarkable simple manner, the coarse code information is clearly and unambiguously allocated to the fine code information so that expensive double scanning and associated switching logic can be eliminated, without placing great demands on the precision of the reducing gear. In this way, a simply constructed and thereby economical multistage angle encoder is provided which achieves high measuring accuracy. Further advantageous features of the invention are set forth in the dependent claims.

The invention itself, together with further objects and attendant advantages, will best be understood by reference to the following detailed description, taken in conjunction with the accompanying drawings.

BRIEF DESCRIPTION OF THE DRAWINGS

FIG. 3 shows a coarse code disc, a fine code disc, and a scanning plate included in the embodiment of FIG. 1.

FIG. 4 shows a fine code disc, a coarse code disc, and a scanning plate utilized in a second prefered embodiment of this invention.

FIG. 5 is a schematic representation of the superimposed tracks of the code discs of FIG. 3.

FIG. 6 is a schematic representation of the superimposed code tracks of the code discs of FIG. 4.

DETAILED DESCRIPTION OF THE PRESENTLY PREFERRED EMBODIMENTS

Figure 1:
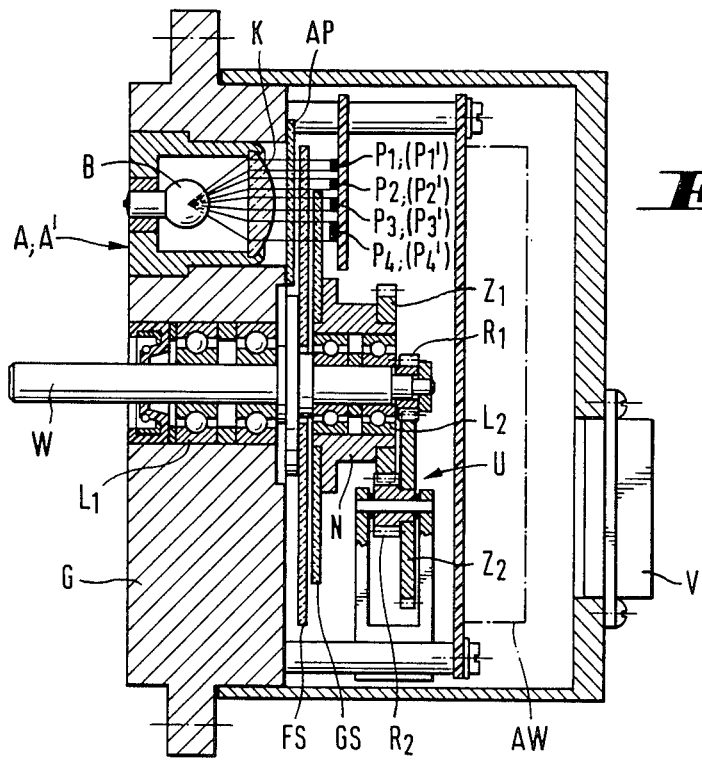
FIG. 1 is a cross-sectional view of a two-stage angle encoder which incorporates a presently preferred embodiment of this invention.

Turning now to the drawings, FIG. 1 provides a cross-sectional view of a two-stage angle encoder which incorporates a presently preferred embodiment of this invention. This angle encoder includes a housing G which is connected with a machine part of a processing machine (not shown). A shaft W is mounted to rotate in the housing G by means of a bearing $L_1$. In use, this shaft W is connected via a suitable coupling with a drive spindle of the processing machine. A fine code disc FS and a pinion $R_1$ are mounted on the shaft W within the housing G. The pinion $R_1$ engages a gear wheel $Z_2$ of a reducing gear U mounted in the housing G. The reducing gear U includes a pinion gear $R_2$ which meshes with and drives a gear wheel $Z_1$ connected with a hub N. The hub N is mounted by means of a bearing $L_2$ to rotate with respect to the shaft W, and a coarse code disc GS is fixedly mounted to the hub N. Thus, the coarse code disc GS is rotatable at a short axial separation from the fine code disc FS and the coarse code disc GS rotates at half the angular velocity of the fine code disc FS as a result of the reduction factor n=2 of the reducing gear U.

A scanning unit A is mounted in the housing G in order to scan photoelectrically the code information of the fine code disc FS and the coarse code disc GS. This scanning unit A includes a light source B, a condenser lens K, a scanning plate AP, and a plurality of photosensitive elements $P_1$–$P_4$. The photosensitive elements $P_1$–$P_4$ generate respective scanning signals which are applied to an evaluating arrangement AW and via a plug connector V to a digital display unit (not shown).

Figure 2:
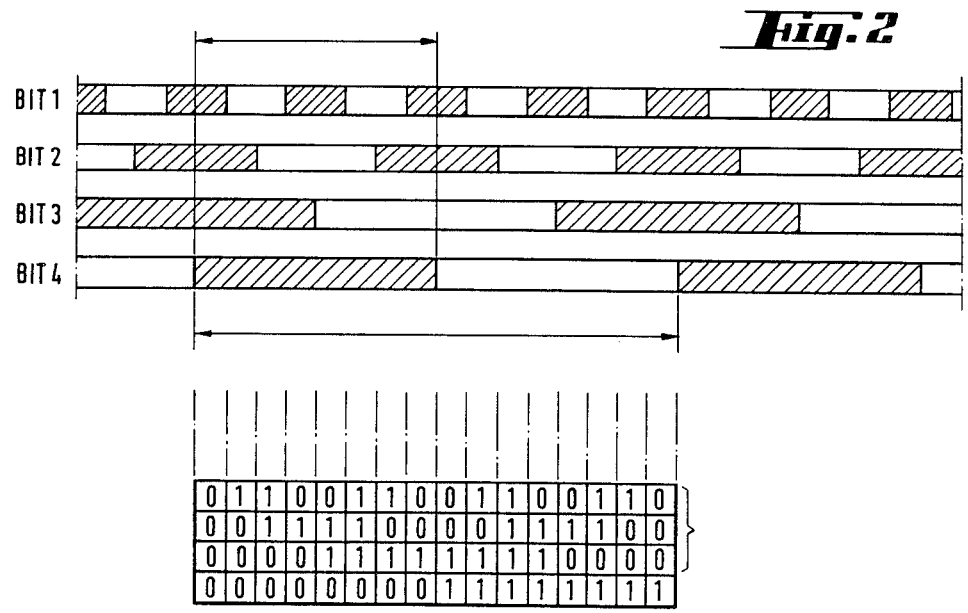
FIG. 2 is a schematic diagram illustrating the code scheme of a four-bit Gray code used in the embodiment of FIG. 1.

FIG. 2 shows the code scheme of a one-step, four-bit Gray code along with a table of the binary combinations. The dark (shaded) fields signify the binary state Zero and the light fields the binary state One.

The one-step transition from one binary state to the next binary state occurs at the edges of the fields.

FIG. 3 shows a first embodiment for the realization of the four-bit Gray code of FIG. 2 in a two-stage angle encoder having a reduction factor n=2. FIG. 3 shows both the fine disc FS, the coarse disc GS, and the scanning plate AP. The fine code information is contained in the fine code tracks 1, 2 of the fine code disc FS, and the coarse code information is contained in the coarse code tracks 3, 4 of the coarse code disc GS.

In addition, for the clear allocation of the coarse code information to the fine code information in a simple, unrepeated scaning of the coarse code tracks 3, 4, there are arranged according to this invention on the fine code disc FS control information data in the form of two control tracks 3', 4' which are directly superimposed over the coarse code information data of the coarse code tracks 3, 4 of the coarse code disc GS, respectively. The coarse code tracks 3,4 of the coarse code disc GS are subdivided in each case into two concentric coarse code half-tracks 3a, 3b; 4a, 4b. Similarly, the control tracks 3', 4' of the fine code disc FS are each subdivided into two concentric control half-tracks 3a', 3b'; 4a', 4b'. The scanning plate AP of the scanning unit A defines two scanning fields $AT_1$, $AT_2$ for the scanning of the fine code tracks 1, 2, respectively, of the fine code disc FS. In addition, the scanning plate AP defines a scanning field $AT_3$ for the scanning in common of the control half-tracks 3a', 3b' of the fine code disc FS and the coarse code half-tracks 3a, 3b of the coarse code disc GS. In a similar manner, the scanning plate AP includes a scanning field $AT_4$ for the scanning in common of the control half-tracks 4a', 4b' of the fine code disc FS and of the coarse code half-tracks 4a, 4b of the coarse code disc GS. A separate respective photoelement $P_1$–$P_4$ is associated with each of the scanning fields $AT_1$–$AT_4$ in the scanning unit A (FIG. 1). When the fine code disc FS rotates through the angle $\phi_1$, the coarse code disc GS rotates through the angle $\phi_2 = \phi_1/2$ as a result of the reduction factor n=2.

FIG. 5 schematically represents the fine code tracks 1,2 and the control half-tracks 3a', 3b', 4a', 4b' of the fine code disc FS, as well as the coarse code half-tracks 3a, 3b, 4a, 4b of the coarse code disc GS, along with the scanning fields $AT_1$–$AT_4$ and a table of the binary combinations. In order better to illustrate the superposition of the control half-tracks 3a', 3b', 4a', 4b' with the respective coarse code half-tracks 3a, 3b, 4a, 4b, the coarse code half-tracks 3a, 3b, 4a, 4b are represented with a greater width and alternate shading (cross-hatching). In this arrangement the binary state of the photosensor is considered to be Zero when the two superimposed half-tracks 3a, 3a', and 3b, 3b' yield a dark field when scanned. Similarly, the binary state is considered to be One if at least one of the two superimposed half-tracks 3a, 3a' and 3b, 3b' yields a light field. These binary states hold in a like manner for the superimposed half-tracks 4a, 4a' and 4b, 4b'. As shown in FIG. 5, the scanning of the tracks 1-4 via the scanning fields $AT_1$–$AT_4$ yields the binary combinations of the Gray code shown in the table of FIG. 2.

As is evident from FIG. 5, a one-step transition from one binary state to the next binary state occurs only at the edges of the light and dark fields of the control information data of the control half-tracks 3a', 3b', 4a', 4b' of the fine code disc FS. For this reason, the coarse code information data on the coarse code half-tracks 3a, 3b, 4a, 4b can be displaced by as much as 90° relative to the control information data on the control half-tracks 3a', 3b', 4a', 4b'. For this reason, the reduction factor n=2 of the reducing gear U can result in a maximum error of 90° with respect to the fine code disc FS before a measuring error results. This maximum error of 90° with respect to the fine code disc FS corresponds to a maximum error of 90°/2 with respect to the coarse code disc GS.

FIG. 4 shows an alternate embodiment for realizing the four-bit Gray code shown in FIG. 2 in a two-stage angle encoder using a reduction factor n=2. In FIG. 4 the fine code disc is identified by the reference symbol FS' and the coarse code disc by the reference symbol GS'. The fine code information is contained in the fine code tracks 1', 2' of the fine code disc FS', and the coarse code information is contained in the coarse code tracks 3c, 4c of the coarse code disc GS'.

In order clearly to allocate the coarse code information to the fine code information in simple scanning of the coarse code tracks 3c, 4c, control information data is applied on the fine code disc FS' in the form of two spiral control tracks 3c', 4c', which are positioned to superpose directly over the coarse code information data of the coarse code tracks 3c, 4c of the coarse code disc GS'. The scanning plate AP' of the scanning unit A' includes scanning fields $AT_1'$, $AT_2'$ for the scanning of the fine code tracks 1', 2' of the fine code disc FS', respectively. In addition, the scanning plate AP' includes a scanning field $AT_3'$ for scanning in common the control track 3c' of the fine code disc FS' and the coarse code track 3c of the coarse code disc GS'. The scanning field $AT_4'$ of the scanning plate AP' is used for the scanning in common of the control track 4c' of the fine code disc FS' and the coarse code track 4c of the coarse code disc GS'. A separate respective photosensitive element $P_1'$–$P_4'$ in the scanning unit A' is associated with each of the scanning fields $AT_1'$–$AT_4'$ (FIG. 1). When the fine code disc FS' rotates through the angle $\phi_1'$, the coarse code disc GS' rotates through the angle $\phi_2 = \phi_1'/2$ as a result of the reduction factor n=2.

FIG. 6 schematically represents the fine code tracks 1', 2' and the control tracks 3c', 4c' of the fine code disc FS', as well as the coarse code tracks 3c, 4c of the coarse code disc GS' and the scanning fields $AT_1'$–$AT_4'$ of the scanning plate AP'. In order to more clearly illustrate the reciprocal superposition, the control tracks 3c', 4c' and the coarse code tracks 3c, 4c are defined by different shading. The binary state is considered to be Zero when the two superposed tracks 3c, 3c' scanned by the scanning field $AT_3'$ yield dark (cross-latched) fields, and the binary state is considered to be One when the two superposed tracks 3c, 3c' yield a field which is at least partially light. These binary states hold in a like manner also for the superposed tracks 4c, 4c'. The scanning of the tracks 1', 2', 3c, 3c', 4c, 4c' by the scanning fields $AT_1'-AT_4'$ yields the same binary combinations of the Gray code as shown in the table of FIG. 2. It is evident that the one-step transition from one binary state to the next binary state occurs exclusively at the edges of the light and dark fields of the control information data of the control tracks $3c'$, $4c'$ of the fine code disc FS'. For this reason, the coarse code information on the coarse code tracks $3c$, $4c$ can be displaced by as much as 90° relative to the control information data on the control tracks $3c'$, $4c'$.

With the reduction factor $n=2$ as described above, a maximum error of 90° is admissible with respect to the fine code disc FS', and a maximum error of 90°/2 is admissible with respect to the coarse code disc GS'.

Of course, the absolute measuring values determined with such an angle encoder can be further processed, as for example in a position display or a numerical control.

It should be understood that a wide range of changes and modifications can be made to the preferred embodiments described above. For example, the invention is not restricted to use with photoelectric measuring systems, but can also be used with magnetic, inductive, or capacitive measuring systems. It is, therefore, intended that the foregoing detailed description be regarded as illustrative rather than limiting, and that it be understood that it is the following claims, including all equivalents, which are intended to define the scope of this invention.

I claim:

1. In a multistage angle encoder of the type comprising a drive shaft, a fine code disc coupled to the drive shaft, means for defining fine code information on the fine code disc, a gear drive coupled to the drive shaft, at least one coarse code disc coupled to the gear drive, means for defining coarse code information on the coarse code disc, and a scanning unit defining at least one scanning axis and positioned to scan the fine and coarse code discs, the improvement comprising:

means for defining control information on the fine code disc, positioned to be superposeable over the coarse code information of the coarse code disc along the scanning axis such that the control information and the coarse code information can be directly and commonly scanned by the scanning unit, said control information adapted to allocate the coarse code information to the fine code information clearly and unambiguously.

2. The invention of claim 1 wherein the coarse code information comprises at least two concentric coarse code tracks on the coarse code disc, each coarse code track comprising two coarse code half tracks, and wherein the control information comprises at least two concentric control tracks on the fine code disc, each control track comprising two control half tracks, each control half track positioned to be superposeable over a respective one of the coarse code half tracks.

3. The invention of claim 1 wherein the coarse code information comprises at least two spiral coarse code tracks on the coarse code disc, and wherein the control information comprises at least two spiral control tracks on the fine code disc, each spiral control track positioned to be superposeable over a respective one of the spiral coarse code tracks.

4. The invention of claim 2 wherein the scanning unit comprises at least two scanning elements, each scanning element positioned to scan in common a respective one of the coarse code tracks and a respective one of the superposeable control tracks.

5. The invention of claim 3 wherein the scanning unit comprises at least two scanning elements, each scanning element positioned to scan in common a respective one of the spiral coarse code tracks and a respective one of the superposeable spiral control tracks.

6. The invention of claim 2 wherein each of the half-tracks is 180° in angular extent.

7. In a multistage angle encoder of the type comprising a drive shaft, a fine code disc coupled to the drive shaft, means for defining fine code information on the fine code disc, a gear drive coupled to the drive shaft, at least one coarse code disc coupled to the gear drive, means for defining coarse code information on the coarse code disc as a plurality of coarse code tracks, and a scanning unit defining at least one scanning axis and positioned to scan the fine and coarse code discs, the improvement comprising:

means for defining control information on the fine code disc as a plurality of control tracks, the control tracks positioned about the fine code disc and a fine code disc positioned with respect to the coarse code disc such that each control track is superposeable over a respective one of the coarse code tracks along the scanning axis thereby allowing the control information and coarse code information to be directly and commonly scanned by the scanning unit, the control information adapted to allocate the coarse code information to the fine code information clearly and unambiguously;

the fine code disc, course code disc, and scanning unit operative to produce a measurement of the angular position of the shaft; the fine code information, control information and coarse code information adapted to allow the coarse code information to be displaced relative to the control information by up to 90° without reducing the accuracy of the angular position measurement.

8. The invention of claim 7 wherein the coarse code tracks comprise spiral tracks and wherein the control tracks comprise spiral tracks.

9. The invention of claim 7 wherein the scanning unit comprises a scanning element positioned to scan in common the coarse code tracks and respective ones of the superposeable control tracks.

10. The invention of claim 8 wherein the scanning unit comprises a scanning element positioned to scan in common the coarse code tracks and respective ones of the superposeable control tracks.

* * * * *